(12) United States Patent
Alshinnawi et al.

(10) Patent No.: US 9,310,852 B2
(45) Date of Patent: Apr. 12, 2016

(54) AUTOMATIC SEALING OF A GAP ALONG A CHASSIS POSITIONED IN A RACK

(71) Applicant: Lenovo Enterprise Solutions (Singapore) Pte. Ltd., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 231 days.

(21) Appl. No.: 14/045,499

(22) Filed: Oct. 3, 2013

(65) Prior Publication Data

US 2015/0098186 A1    Apr. 9, 2015

(51) Int. Cl.
| | |
|---|---|
| *G06F 1/20* | (2006.01) |
| *H05K 5/00* | (2006.01) |
| *H05K 7/20* | (2006.01) |
| *G06F 1/18* | (2006.01) |
| *H05K 7/14* | (2006.01) |

(52) U.S. Cl.
CPC .............. *G06F 1/183* (2013.01); *H05K 7/1489* (2013.01); *H05K 7/20736* (2013.01); *G06F 1/20* (2013.01)

(58) Field of Classification Search
CPC .......... G06F 1/183; G06F 1/20; H05K 7/1485
USPC .......................... 361/679.01, 679.02, 679.58
See application file for complete search history.

(56) References Cited

U.S. PATENT DOCUMENTS

| | | | | |
|---|---|---|---|---|
| 5,351,176 A | * | 9/1994 | Smith et al. ............. | G06F 1/181 248/917 |
| 5,879,789 A | | 3/1999 | Dolan et al. | |
| 5,964,465 A | | 10/1999 | Mills et al. | |
| 6,460,948 B2 | * | 10/2002 | Roesner .................. | G06F 1/184 312/223.1 |

(Continued)

FOREIGN PATENT DOCUMENTS

| | | |
|---|---|---|
| EP | 0953793 A2 | 11/1999 |
| EP | 1914390 A2 | 4/2008 |
| EP | 2520358 A1 | 11/2012 |

OTHER PUBLICATIONS

Nicolaou et al., "Mechanical Metamaterials with Negative Compressibility Transitions", Nature Materials 11, 608-613 (2012), arXiv:1207.2185v1 [cond-mat.mtrl-sci] Jul. 9, 2012, 12 pages.

(Continued)

*Primary Examiner* — Bernard Rojas
(74) *Attorney, Agent, or Firm* — Katherine S. Brown; Jeffrey L. Streets

(57) ABSTRACT

An apparatus includes a chassis having longitudinal rails for guiding the chassis to move longitudinally into and out of a rack. A flexible sealing member is secured to at least one longitudinal surface of the chassis along a lateral pathway, wherein the flexible sealing member has a first side secured to the chassis, a second side secured to a rigid frame, and a central portion extending between the first and second ends. An actuator is positioned within the rack and is longitudinally aligned with the rigid frame. Accordingly, moving the chassis longitudinally into the rack causes the rigid frame to engage the actuator and then elastically flex the central portion of the flexible sealing member to extend outwardly from the longitudinal surface of the chassis.

18 Claims, 7 Drawing Sheets

(56) References Cited

U.S. PATENT DOCUMENTS

| | | | |
|---|---|---|---|
| 6,485,809 | B1 | 11/2002 | Minor et al. |
| 6,775,131 | B2 * | 8/2004 | Hanson .................. G06F 1/183 312/223.1 |
| 7,430,118 | B1 | 9/2008 | Noteboom et al. |
| 2009/0308579 | A1 | 12/2009 | Johnson et al. |
| 2010/0248609 | A1 | 9/2010 | Tresh et al. |
| 2012/0171944 | A1 | 7/2012 | Heidenberger et al. |

OTHER PUBLICATIONS

Data Center Resources, "Cool Shield AirStrip", Cool Shield AirStrip—Foam Strips to Seal Server Cabinets—Data Center Resources, Home Page>> Equipment Cooling>> Cooling Accessories>> Blanking Panels>> Cool Shield AirStrip, Jun. 20, 2013, 4 pages.

MIT Technology Review—News & Analysis—Read & Watch Forrester's Tech Stragegies for New Realities, "How to Make a Metamaterial that Expands Under Pressure and Contracts in Tension", http://www.technologyreview.com/view/428492/how-to-make-a-metamaterial-that-expand, (The Physics arXiv Blog), Jul. 12, 2012, 12 pages.

"PolarDAM Air Dam Foam—Sealing Racks", https://sites.google.com/site/airdamfoam/sealing-racks, Jun. 20, 2013, 2 pages.

Hannaford, Peter, "Ten Colling Solutions to Support High-Density Server Deployment" APC—White Papaer #42 Revision 3, 2006-2008 American Power Conversion, 16 pages. This document only identifies the year of publication (without the month), but the year of publication is sufficiently earlier than the effective U.S. filing date and any foreign priority date so that the particular month of publication is not in issue. See MPEP 609.04(a).

* cited by examiner

AUTOMATIC SEALING OF A GAP ALONG A CHASSIS POSITIONED IN A RACK

BACKGROUND

1. Field of the Invention

The present invention relates to the control of airflow direction in a rack of electronic devices, and more particularly to the prevention of hot air recirculation.

2. Background of the Related Art

Computer systems consume power and produce heat as a byproduct of power consumption. In particular, computer systems often include many rack-mounted components in a high-density arrangement, which can produce a considerable amount of heat. Thermal management of computer systems requires removing excess heat to control internal temperatures, which may increase the reliability, performance, and longevity of the equipment. In a rack-mounted computer system, for example, rack-mounted blowers are typically used to generate airflow through the rack to remove the excess heat and cool the components. Innovations in computer technology have resulted in increasing component density and power consumption of rack-mounted computer systems, with a corresponding increase in the amount of heat produced. These increases in power consumption and heat production have heightened the emphasis on thermal management of rack-mounted computer systems.

The arrangement of equipment racks in a datacenter can have a dramatic effect on the performance of the cooling system. Racks are commonly arranged in an organized hot-aisle/cold-aisle layout to minimize the likelihood of appreciable volumes of heated exhaust air from directly re-entering the racks. A hot-aisle/cold-aisle layout may include alternating hot aisles and cold aisles, with the front of each rack facing a cold aisle and the rear of each rack directed toward a hot aisle. A computer room air conditioner (CRAC) supplies cool air to the cold aisles. The cool air from the cool aisle is drawn into the front of each rack and the heated air is exhausted through the rear of the rack to the hot aisle. The heated exhaust air then recirculates through the CRAC to be cooled and returned back to the cold aisles.

Recirculation of heated air is another issue affecting rack mounted equipment. Rack systems typically house a number of elements having interrelated airflow and heating patterns. Recirculation can be induced in open areas between the rack-mounted equipment, such as in and around empty slots. Ideally, these rack openings are blocked off by bolting blank filler panels to the rack frame. If the blank filler panels are left off, however, the pressure difference created by fans within the rack mounted equipment can force heated exhaust air to travel forward through the rack via a missing panel to the front of the equipment, where the heated air is sucked back into the equipment. Undesirable recirculation of hot air through gaps between components within a rack can also occur as a result of air flow impedance that is associated with use of a rear door heat exchanger.

Recirculation of warm air can cause rack mounted equipment to experience a substantial temperature increase. The additional heat introduced to the equipment by recirculating warm air may cause the equipment to exceed thermal thresholds, particularly if the equipment is operating in a room that is very warm to begin with, or if the amount of heating that takes place within the equipment is substantial. These high temperatures can cause the equipment to shut down or require it to be removed from service. Some portions of rack mounted equipment may experience more recirculation than others, which may interfere with the proper diagnosis of thermal problems. The difference between ambient room temperature air and heated air exiting from the back of rack mounted equipment can easily be 20 to 30° C. or more.

BRIEF SUMMARY

One embodiment of the present invention provides an apparatus, comprising a rack for selectively receiving a plurality of chassis, and a chassis having longitudinal surfaces including a top surface, a bottom surface, a first side surface and a second side surface. A first longitudinal rail is secured to a first side of the rack and a second longitudinal rail is secured to a second side of the rack, wherein the first and second longitudinal rails guide the chassis to move longitudinally into and out of the rack. The apparatus further comprises a flexible sealing member secured to at least one of the longitudinal surfaces of the chassis along a lateral pathway, wherein the flexible sealing member has a first side secured to the chassis, a second side secured to a rigid frame, and a central portion extending between the first and second ends. An actuator is positioned within the rack and is longitudinally aligned with the rigid frame. Accordingly, moving the chassis longitudinally into the rack causes the rigid frame to engage the actuator and then elastically flex the central portion of the flexible sealing member to extend outwardly from the longitudinal surface of the chassis.

DETAILED DESCRIPTION

Figure 1:
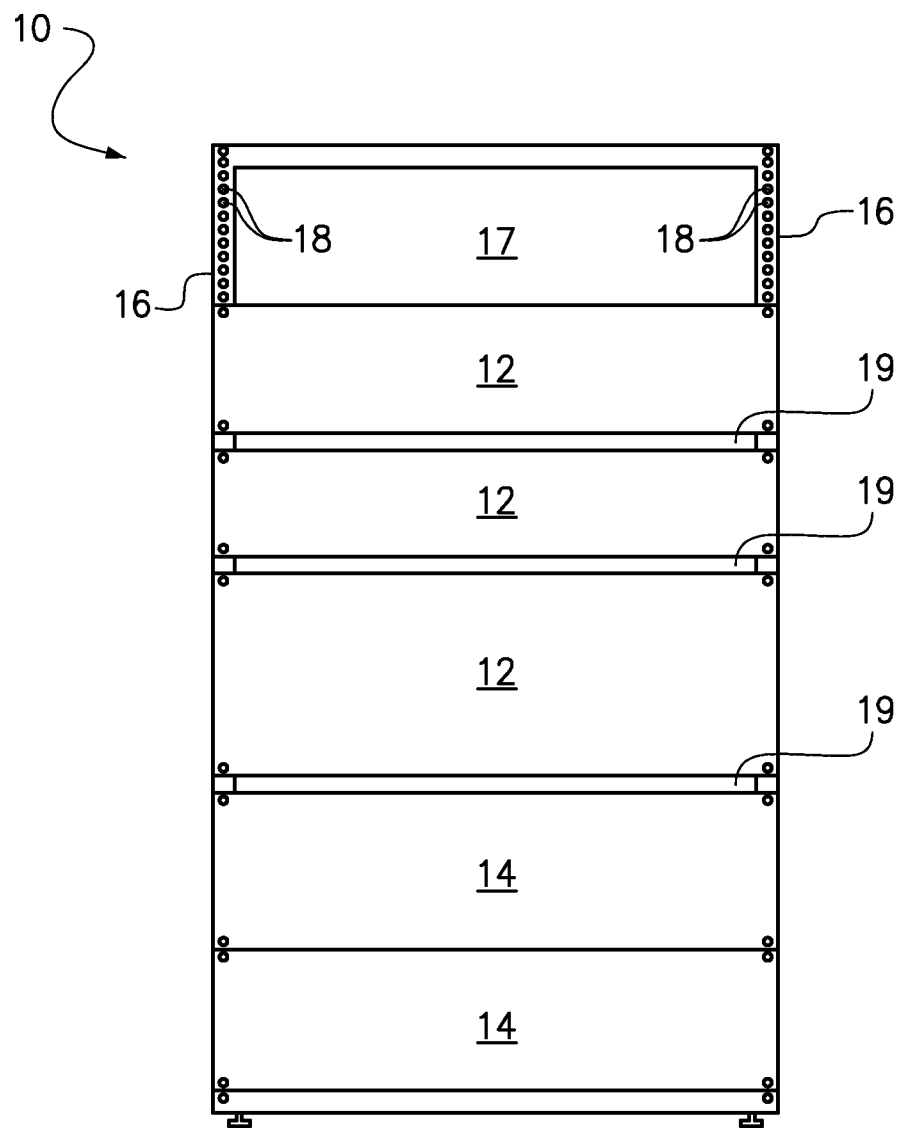
FIG. 1 is a diagram front elevation view of a rack supporting a number of chassis.

One embodiment of the present invention provides an apparatus, comprising a rack for selectively receiving a plurality of chassis, and a chassis having longitudinal surfaces including a top surface, a bottom surface, a first side surface and a second side surface. A first longitudinal rail is secured to a first side of the rack and a second longitudinal rail is secured to a second side of the rack, wherein the first and second longitudinal rails guide the chassis to move longitudinally into and out of the rack. The apparatus further comprises a flexible sealing member secured to at least one of the longitudinal surfaces of the chassis along a lateral pathway, wherein the flexible sealing member has a first side secured to the chassis, a second side secured to a rigid frame, and a central portion extending between the first and second ends. An actuator is positioned within the rack and is longitudinally aligned with the rigid frame. Accordingly, moving the chassis longitudinally into the rack causes the rigid frame to engage the actuator and then elastically flex the central portion of the flexible sealing member to extend outwardly from the longitudinal surface of the chassis.

The flexible sealing member is preferably secured to the outer surface of the chassis along a lateral pathway adjacent a front face of the chassis. In one example, the flexible sealing member may be secured to the top surface of the chassis, such that moving the chassis longitudinally into the rack causes the rigid frame to engage the actuator and then elastically flex the central portion of the flexible sealing member to extend outwardly from the top surface of the chassis to seal against a bottom surface of an adjacent chassis received within the rack. In another example, the flexible sealing member is secured to the first side surface of the chassis, such that moving the chassis longitudinally into the rack causes the rigid frame to engage the actuator and then elastically flex the central portion of the flexible sealing member to extend outwardly from the first side surface of the chassis to seal against a side surface of the rack. The flexible sealing member may be secured using glue, rivets, screws, bolts, physical constraints, or other means.

In a further embodiment of the apparatus, the flexible sealing member is secured to the top surface of the chassis, the first side surface of the chassis and the second side surface of the chassis, and the rigid frame extends along the top surface of the chassis, the first side surface of the chassis and the second side surface of the chassis. Accordingly, moving the chassis longitudinally into the rack causes the rigid frame to engage the actuator and then elastically flex the central portion of the flexible sealing member to extend outwardly from the top surface of the chassis to seal against a surface of an adjacent chassis received within the rack, to extend outwardly from the first side surface of the chassis to seal against a first side surface of the rack, and to extend outwardly from the second side surface of the chassis to seal against a second side surface of the rack. Optionally, the rigid frame may extend under the bottom surface of the chassis, even if the flexible sealing member does not extend under the bottom surface of the chassis. This may help the rigid frame to translate longitudinally back and forward without getting twisted or tilted. Furthermore, the flexible sealing member may be secured along a lateral pathway adjacent a front face of the chassis.

The expandable sealing member may be made with conventional materials, such as elastomeric polymers or rubbers, or with metamaterials characterized by negative compressibility transitions. Optionally, the elastomeric polymers or rubbers may be formed into a flexible foam.

In another embodiment, the first and second longitudinal rails may be telescoping slide rails having a first portion secured to the rack and a second portion secured to the chassis. Alternatively, the chassis may include a first longitudinal rail secured to the first side surface of the chassis and a second longitudinal rail secured to the second surface of the chassis, wherein the first longitudinal rail of the chassis slidably engages the first longitudinal rail of the rack and the second longitudinal rail of the chassis slidably engages the second longitudinal rail of the rack. Either of these or other rail configurations can produce the same relative longitudinal movement of the chassis into the rack.

The actuator may, for example, include a first actuation member disposed on a first lateral side of the rack and a second actuation member disposed on a second lateral side of the rack. Optionally, the first actuation member may be secured to a first rail and the second actuation member may be secured to a second rail. In an independent option, the first and second actuation members may be spring-biased to longitudinally retract under a reactive force of the flexible sealing member that has been elastically flexed.

In a further embodiment, the apparatus may comprise a biasing member supporting the actuation member(s) and allowing the actuation member (s) to retract under a longitudinal force. Where the gap between two chassis is small, this will prevent excessive pressures on the flexible sealing member and make it easier to position the chassis fully into the rack.

Still further, the apparatus may comprise a fastener for securing the chassis in a fully installed position within the rack and preventing longitudinal movement of the chassis relative to the rack. The fastener may be a latch or a threaded bolt that secures a chassis flange to a vertical rack rail.

FIG. 1 is a diagram front elevation view of a rack 10 supporting a number of chassis 12 and fillers 14. The rack 10 itself includes vertical side rails 16 having spaced apart holes 18 or similar features for use in securing the chassis and fillers. Gaps 19 exist between some of the adjacent chassis and fillers, such that air can recirculate from one side of the rack to the other without going through a chassis. In particular, hot exhaust air from a hot aisle or the back of the rack components may recirculate to the cold aisle or front of the rack components. A chassis or filler has been left off of the space 17 for the purpose of illustrating the vertical side rails 16 of the rack 10. Typically, the open space 17 would also receive either a chassis 12 or a filler 14.

Figure 2A:
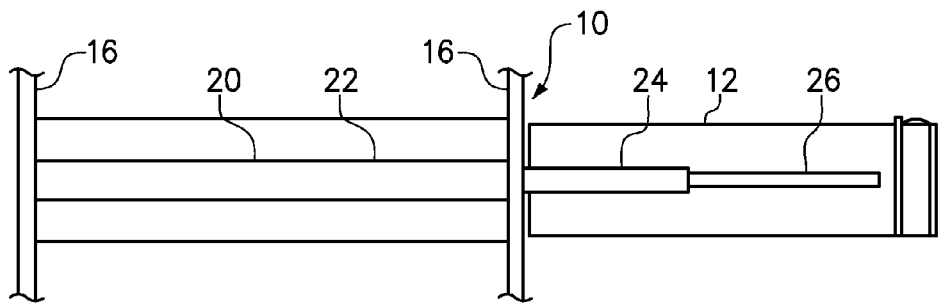
FIGS. 2A-B are schematic side views of a telescoping slide rail for securing a chassis in a rack.
Figure 2B:
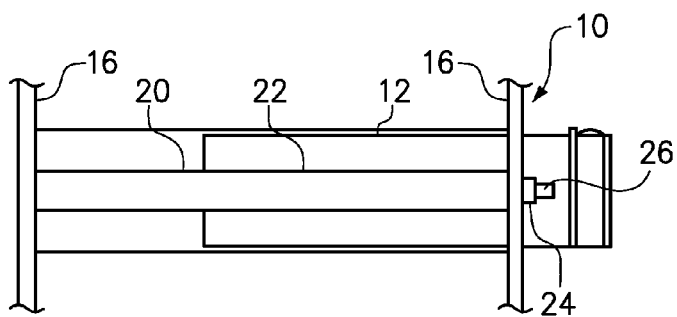

FIGS. 2A-B are schematic side views of a telescoping slide rail 20 for securing a chassis 12 in a rack 10. Referring to FIG. 2A, the telescoping slide rail 20 includes a first slide rail segment 22 secured between the two vertical side rails 16 of the rack 10. The telescoping slide rail 20 also includes a second slide rail segment 24 that is slidably received within the first segment 22, and a third slide rail segment 26 that is slidably received within the second segment 24. A typically telescoping slide rail 20 may incorporate ball bearing assemblies (not shown) to facilitate the sliding action, while also stabilizing the longitudinal movement of the rail segments. The chassis 12 is preferably secured to the third slide rail segment 26. FIG. 2B shows that as the chassis 12 is pushed into a region of the rack (i.e., a bay of the rack), the rail segments nest one inside the other while maintaining support of the chassis 12. The movement of the chassis 12 between the position of FIG. 2A and the position of FIG. 2B is a longitudinal movement.

Figure 2C:
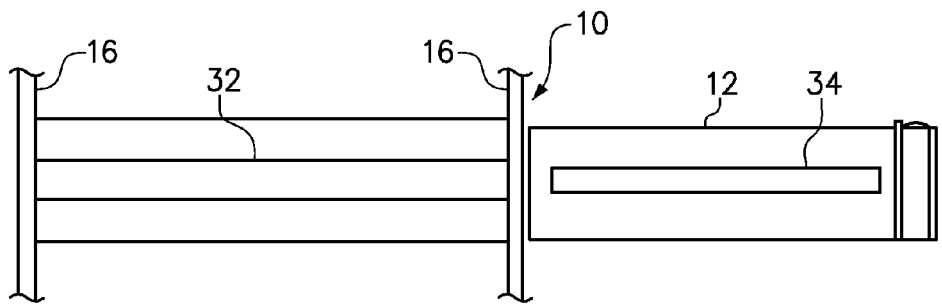
FIGS. 2C-D are schematic side views of a simple slide rail for securing a chassis in a rack.
Figure 2D:
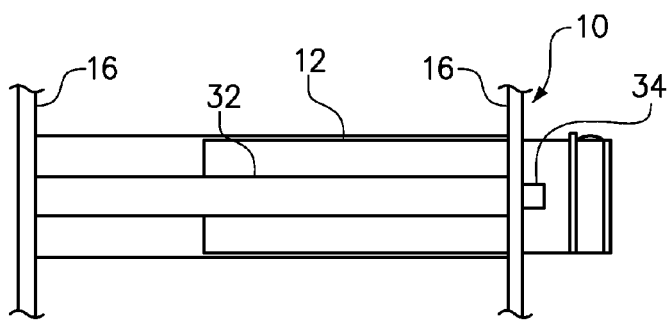

FIGS. 2C-D are schematic side views of a simple slide rail system for securing a chassis 12 in a rack 10. Referring to FIG. 2C, the simple slide rail system includes a first slide rail segment 32 secured between the two vertical side rails 16 of the rack 10, and a second slide rail segment 34 that is secured to the lateral sides of the chassis 12. The second rail segment 34 is aligned with, and selectively receivable within, the first rail segment 32. FIG. 2D shows that as the second rail segment 34 is guided into the first rail segment 32 and the chassis 12 is pushed into a region of the rack (i.e., a bay of the rack), the second rail segment is received inside the first rail segment while maintaining support of the chassis 12. The movement of the chassis 12 between the position of FIG. 2C and the position of FIG. 2D is a longitudinal movement.

Figure 3:
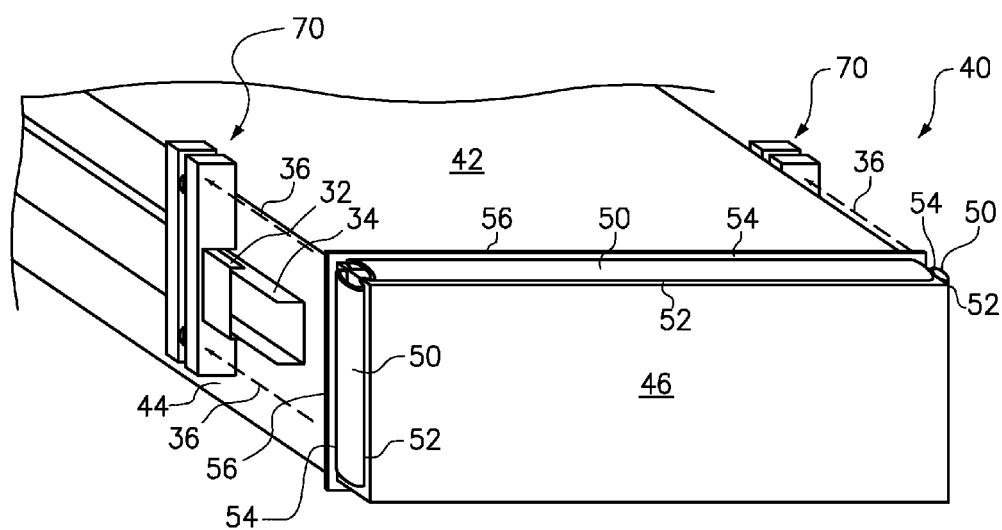
FIG. 3 is a perspective view of the front end of a chassis including a flexible sealing member secured to the chassis and aligned with an actuator.

FIG. 3 is a perspective view of the front end of a chassis 40 including a flexible sealing member 50 secured to the chassis 40 and longitudinally aligned with first and second actuation members 70. As with FIGS. 2C-2D, the chassis 40 is secured to the rail 34 and is slidably received into the rail 32 that is secured to the vertical rack rails 16 (see FIGS. 2C-2D), such that the chassis 40 can only move back and forth (i.e., in and out of the rack) in a longitudinal direction. The dashed arrows 36 show the longitudinal alignment of the flexible sealing member 50 with the actuation members 70.

The flexible sealing member 50 is, for example, a preformed elastomeric polymer or rubber member that has a first side 52 secured to the top surface 42, as well as the left and right side surfaces 44 of the chassis 40 along a lateral pathway adjacent the front 46 of the chassis. A second side 54 of the flexible sealing member 50 is secured to a rigid frame 56 that is longitudinally aligned for contact with the first and second actuation members 70. The rigid frame 56 is free to slide along the longitudinal surfaces 42, 44 of the chassis 40. Further details about the use of the flexible sealing member 50, the rigid frame 56, and the actuation members 70 is provided in reference to FIGS. 4A-D, below.

FIGS. 4A-D are schematic side views of a front portion of the chassis 40 as the chassis 40 is moved longitudinally into the rack 10. The rail 32 of the rack and the rail 34 of the chassis interact as described in reference to FIGS. 2A, 2B and 3 to guide the longitudinal insertion of the chassis into the rack with the frame 56 aligned for contact with the actuation member 70. While only one side of the chassis 40 is shown, it should be understood that similar rails are present on the opposite side of the rack and chassis, and that another portion of the frame 56 may extend to the opposite side of the chassis where that other portion of the frame is aligned for contact with a second actuation member 70 (see FIG. 3).

It is important to note that the first side 52 of the flexible sealing member 50 is secured to the surface of the chassis 40, but the second side 54 of the flexible sealing member 50 is secured to the frame 56. The sides 54, 56 of the flexible sealing member 50 may be secured in various manners, but are shown here to be secured with fasteners 55. As shown, the frame 56 has an "L-shaped" cross-section having a leg that lies flat against the surface of the chassis 40 and a leg that is generally perpendicular to the surface of the chassis for engaging the actuation member 70.

Figure 4A:
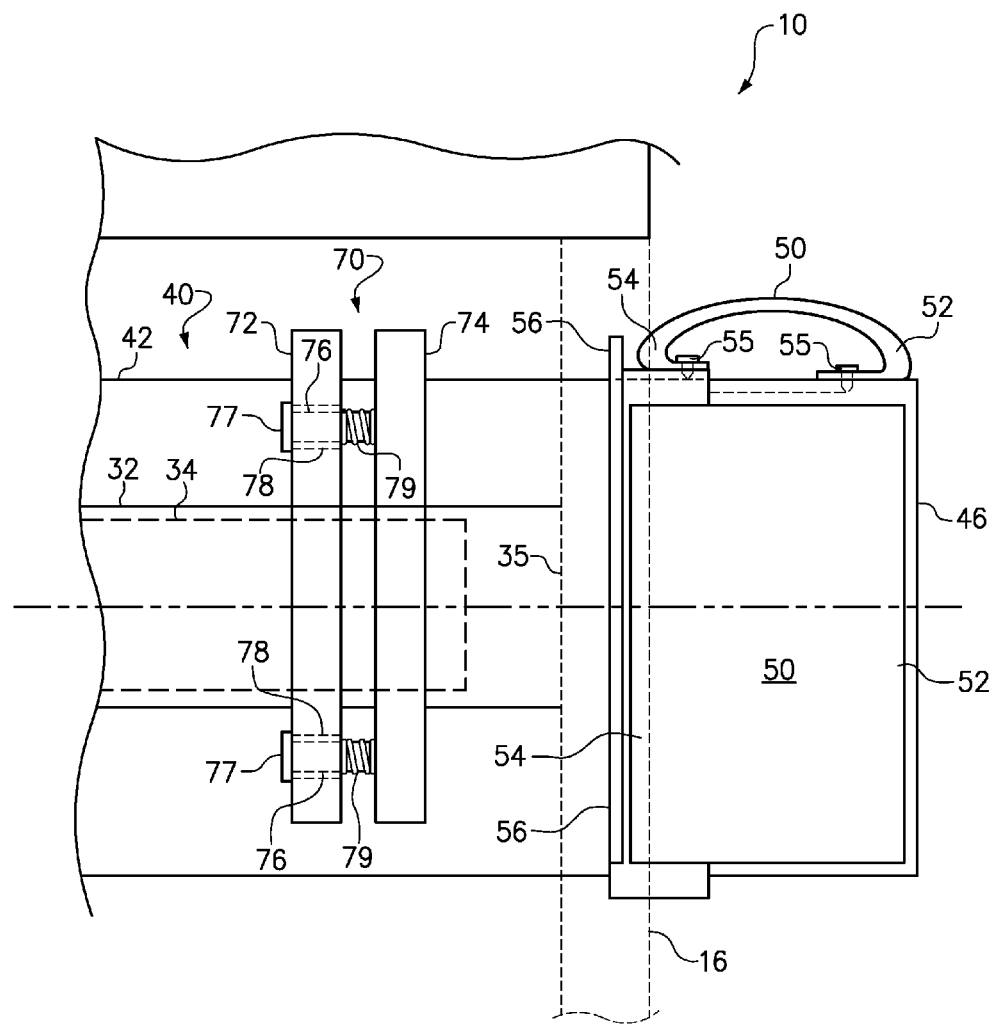
FIGS. 4A-D are schematic side views of the flexible sealing member and actuator as the chassis is progressively installed in the rack.

In FIG. 4A, the back end (not shown) of the chassis 40 is in the rack 10 and the front end 46 only remains a short distance from the vertical rail member 16 at the front of the rack 10. As a result, the rail 34 of the chassis is received within the rail 32 of the rack and guides the longitudinal movement of the chassis into the rack with the frame 56 longitudinally aligned for contact with the actuation member 70. However, since the frame 56 has not yet contacted the actuation member 70, the flexible sealing member 50 has not yet been flexed outwardly. The vertical rail member 16 has been illustrated with dashed lines to avoid obscuring detail about the operation of the invention, but the rack rail 34 is preferably connected to the vertical rail member 16 at the front end 35.

In the embodiment shown, the actuation member 70 is secured to the rail 32. More specifically, the actuation member 70 includes a first bracket 72 that is affixed to the rail 32 and a second bracket 74 that is free to longitudinally retract toward the first bracket 72. This movement of the second bracket 74 is accommodated by a pair of parallel posts 76 that are fixed to the second bracket 74 and extend through holes 78 in the first bracket 72. Each post 76 has a head 77 that prevents the post from pulling out of the hole 78. Each post 76 also has a spring 79 that is received about the post 76 and between the first and second brackets 72, 74 to bias the second bracket 74 forward.

Figure 4B:
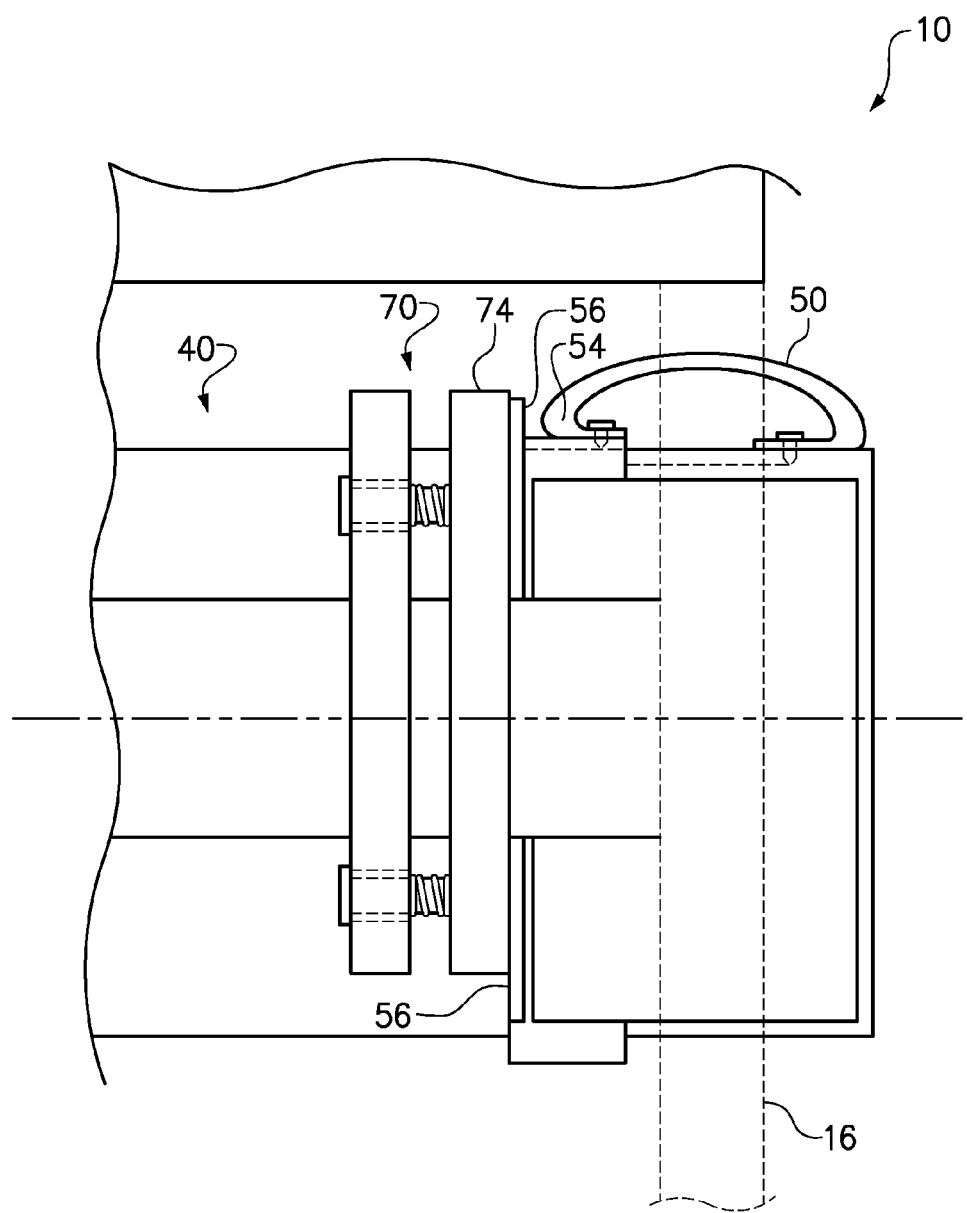

In FIG. 4B, the chassis 40 has been inserted further into the rack 10 through longitudinal movement, but is not yet fully inserted. As shown, the frame 56, which is attached to the second side 54 of the flexible sealing member 50, has just come into contact with the second bracket 74 of the actuation member 70.

Figure 4C:
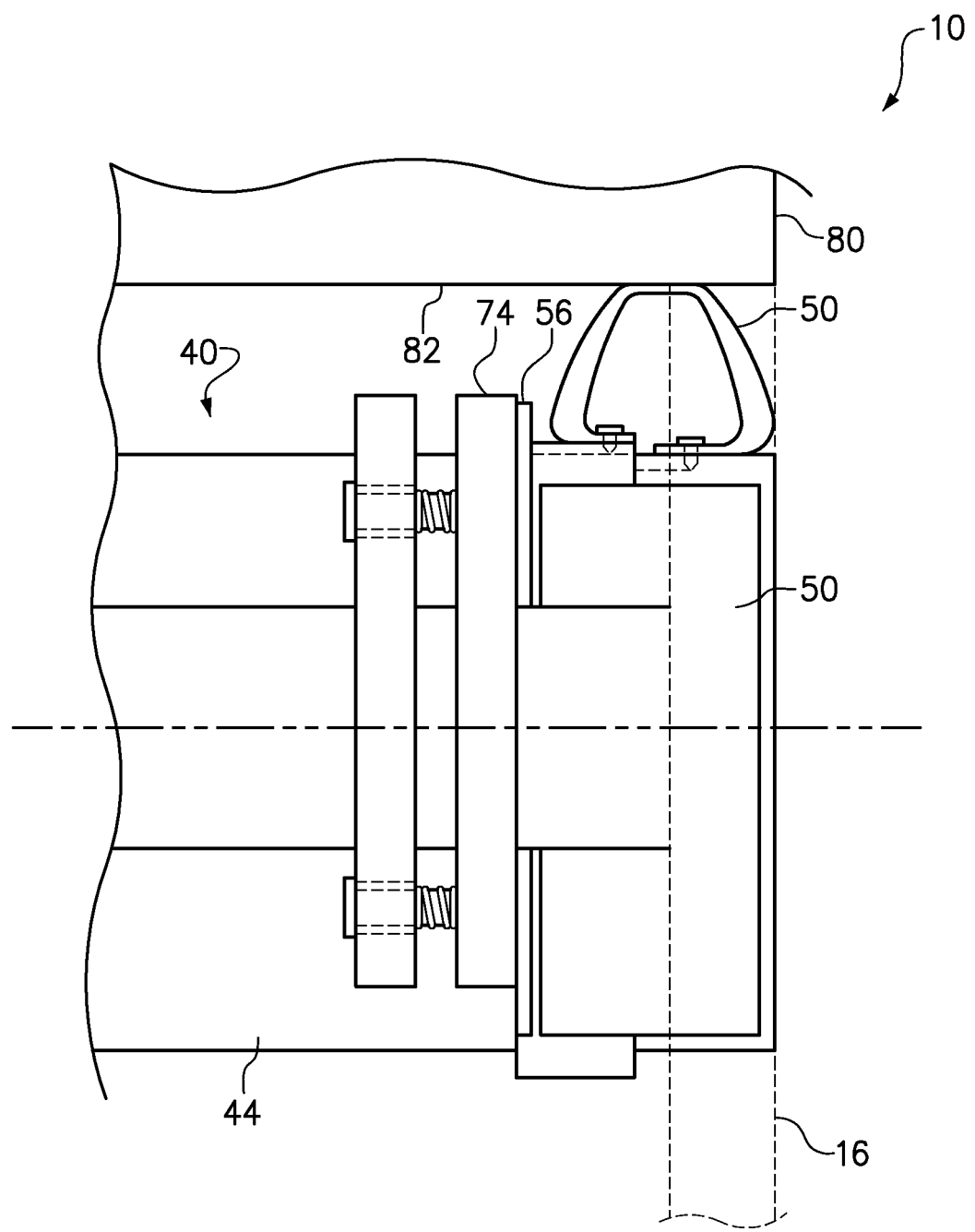

In FIG. 4C, the chassis 40 has been inserted still further into the rack 10 through longitudinal movement, and is now fully inserted. The frame 56 has encountered resistance against longitudinal movement from the second bracket 74 of the actuation member 70. As a result of the longitudinal movement of the chassis 40, the flexible sealing member 50 has flexed outwardly (upwardly in FIG. 4C) and now engages the bottom surface 82 of an adjacent chassis 80. Accordingly, the airflow gap that would have existed between the two adjacent chassis 40, 80 has been sealed off. The flexible sealing member 50 secured to the side 44 of the chassis 40 will also be flexed outwardly to seal off airflow pathways between the side 44 of the chassis 40 and the side of the rack 10.

Figure 4D:
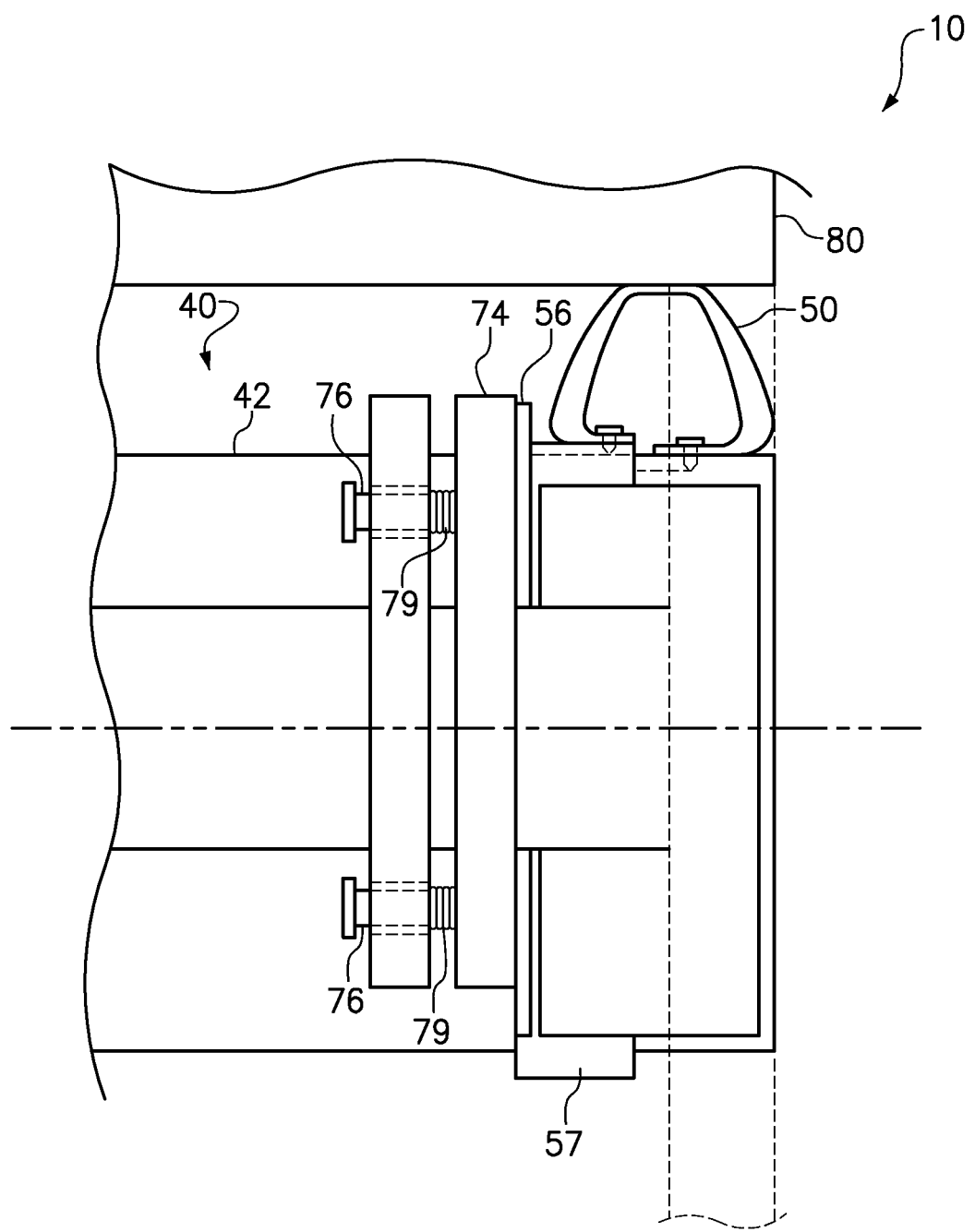

In FIG. 4D, the chassis 40 remains in the fully inserted position of FIG. 4C. However, if the gap between the two adjacent chassis 40, 80 is small relative to the distance that the flexible sealing member 50 can flex outwardly, then the flexible sealing member 50 quickly engages the adjacent chassis 80 and opposes further flexing. Since the frame 56 slides along the top surface 42 of the chassis 40, the frame 56 pushes against the second bracket 74 to relieve some of the force built up within the flexible sealing member 50. The force of the frame 56 against the second bracket 74 may be great enough to cause the springs 79 to compress and allow the second bracket 74 to retract longitudinally toward the first bracket 72. This gives the flexible sealing member 50 more room (in the longitudinal direction). Notice that the second bracket 74 has moved closer to the first bracket 72, such that the post 76 now extends from the hole 78. Also notice that the frame 56 has a shoulder 57 that extends under the edge of the chassis 40 to keep the frame 56 from tilting.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
   a rack for selectively receiving a plurality of chassis;
   a chassis having longitudinal surfaces including a top surface, a bottom surface, a first side surface and a second side surface;
   a rigid frame extending along the at least one of the longitudinal surfaces of the chassis;
   a flexible sealing member secured to at least one of the longitudinal surfaces of the chassis along a lateral pathway, wherein the flexible sealing member has a first end secured to the chassis, a second end secured to the rigid frame, and a central portion extending between the first and second ends;

a first longitudinal rail secured to a first side of the rack and a second longitudinal rail secured to a second side of the rack, wherein the first and second longitudinal rails guide the chassis to move longitudinally into and out of the rack; and an actuator positioned within the rack and longitudinally aligned with the rigid frame;

wherein moving the chassis longitudinally into the rack causes the rigid frame to engage the actuator and then elastically flex the central portion of the flexible sealing member to extend outwardly from the longitudinal surface of the chassis.

2. The apparatus of claim 1, further comprising:

a biasing member supporting the actuator and allowing the actuator to retract under a longitudinal force.

3. The apparatus of claim 1, wherein the flexible sealing member is secured to the outer surface of the chassis along a lateral pathway adjacent a front face of the chassis.

4. The apparatus of claim 1, wherein the flexible sealing member is secured to the top surface of the chassis, and wherein moving the chassis longitudinally into the rack causes the rigid frame to engage the actuator and then elastically flex the central portion of the flexible sealing member to extend outwardly from the top surface of the chassis to seal against a surface of an adjacent chassis received within the rack.

5. The apparatus of claim 1, wherein the flexible sealing member is secured to the first side surface of the chassis, and wherein moving the chassis longitudinally into the rack causes the rigid frame to engage the actuator and then elastically flex the central portion of the flexible sealing member to extend outwardly from the first side surface of the chassis to seal against a side surface of the rack.

6. The apparatus of claim 1, wherein the chassis is latched in a fully installed position within the rack to prevent longitudinal movement of the chassis relative to the rack.

7. The apparatus of claim 1, wherein the first and second longitudinal rails are telescoping slide rails having a first portion secured to the rack and a second portion secured to the chassis.

8. The apparatus of claim 1, wherein the chassis includes a first longitudinal rail secured to the first side surface of the chassis and a second longitudinal rail secured to the second surface of the chassis, and wherein the first longitudinal rail of the chassis slidably engages the first longitudinal rail of the rack and the second longitudinal rail of the chassis slidably engages the second longitudinal rail of the rack.

9. The apparatus of claim 1, wherein the flexible sealing member is a flexible foam.

10. The apparatus of claim 1, wherein the flexible sealing member is a metamaterial characterized by negative compressibility transitions.

11. The apparatus of claim 1, wherein the actuator includes a first actuation member disposed on a first lateral side of the rack and a second actuation member disposed on a second lateral side of the rack.

12. The apparatus of claim 11, wherein the first actuation member is secured to a first rail and the second actuation member is secured to a second rail.

13. The apparatus of claim 11, wherein the first and second action members are spring-biased to longitudinally retract under a reactive force of the flexible sealing member that has been elastically flexed.

14. The apparatus of claim 11, wherein the flexible sealing member is secured to the top surface of the chassis, the first side surface of the chassis and the second side surface of the chassis, wherein the rigid frame extends along the top surface of the chassis, the first side surface of the chassis and the second side surface of the chassis, and wherein moving the chassis longitudinally into the rack causes the rigid frame to engage the actuator and then elastically flex the central portion of the flexible sealing member to extend outwardly from the top surface of the chassis to seal against a surface of an adjacent chassis received within the rack, to extend outwardly from the first side surface of the chassis to seal against a first side surface of the rack, and to extend outwardly from the second side surface of the chassis to seal against a second side surface of the rack.

15. The apparatus of claim 14, wherein the rigid frame extends under the bottom surface of the chassis, and the flexible sealing member does not extend under the bottom surface of the chassis.

16. The apparatus of claim 14, wherein the flexible sealing member is secured along a lateral pathway adjacent a front face of the chassis.

17. The apparatus of claim 1, wherein the rigid frame slides along at least one of the longitudinal surfaces of the chassis.

18. The apparatus of claim 1, wherein the rigid frame has an L-shaped cross-section having a leg that lies flat against the surface of the chassis and a leg that is generally perpendicular to the surface of the chassis for engaging the actuator.

* * * * *